(12) United States Patent
Schillaci

(10) Patent No.: US 8,206,523 B1
(45) Date of Patent: Jun. 26, 2012

(54) METHOD OF APPLYING DESIGN TO A SUBSTRATE

(76) Inventor: Sam P. Schillaci, Spring, TX (US)

( * ) Notice: Subject to any disclaimer, the term of this patent is extended or adjusted under 35 U.S.C. 154(b) by 150 days.

(21) Appl. No.: 12/466,373

(22) Filed: May 14, 2009

Related U.S. Application Data

(60) Provisional application No. 61/053,078, filed on May 14, 2008.

(51) Int. Cl.
| | |
|---|---|
| *B44C 3/12* | (2006.01) |
| *B44C 1/17* | (2006.01) |
| *B44C 1/165* | (2006.01) |
| *B29C 65/00* | (2006.01) |
| *B32B 37/00* | (2006.01) |
| *B32B 38/00* | (2006.01) |
| *B32B 38/04* | (2006.01) |
| *B44D 2/00* | (2006.01) |
| *B31B 1/60* | (2006.01) |
| *H05K 13/04* | (2006.01) |

(52) U.S. Cl. ............ 156/63; 156/62; 156/235; 156/297; 156/264; 156/60; 156/250; 156/256; 156/230

(58) Field of Classification Search .............. 156/60, 156/62, 63, 230, 235, 250, 256, 264, 297
See application file for complete search history.

(56) References Cited

U.S. PATENT DOCUMENTS

| | | | |
|---|---|---|---|
| 1,429,445 A | | 9/1922 | Merritt |
| 2,264,244 A | | 11/1941 | Lytle |
| 2,303,120 A | | 11/1942 | Greaves-Walker |
| 4,559,732 A | | 12/1985 | Levy et al. |
| 4,992,120 A | * | 2/1991 | Badura ........................ 156/62 |
| 5,214,870 A | | 6/1993 | Cohen |
| 5,344,680 A | | 9/1994 | Logan et al. |
| 5,421,939 A | * | 6/1995 | Scher et al. ................ 156/235 |
| 5,484,495 A | | 1/1996 | Moore |
| 6,375,332 B1 | | 4/2002 | Whinney |
| 6,866,516 B2 | | 3/2005 | Smith et al. |
| 2006/0073466 A1 | | 4/2006 | Solomon |
| 2006/0285914 A1 | | 12/2006 | Bassford et al. |

* cited by examiner

*Primary Examiner* — Christopher Schatz
*Assistant Examiner* — Matthew Hoover
(74) *Attorney, Agent, or Firm* — Keeling Patents & Trademarks, LLC; Melissa M. Martinez; Heather N. Schmidt

(57) ABSTRACT

A process of manufacturing a multi-shade design on an at least semi-transparent substrate having a first surface and a second surface. The process comprising a template preparation step of preparing a template, the template being visible through the substrate, applying a first design film to a surface of the substrate, carving at least a portion of the first design film, applying a second design film over the first surface, and carving at least a portion of the second design film. An alternative process of manufacturing a multi-color design comprising the template preparation step, applying a first design film, of a first color, to the first surface, carving the first region, applying a second design film, of a second color, to the first surface, and carving the second region from the second design film.

20 Claims, 4 Drawing Sheets

METHOD OF APPLYING DESIGN TO A SUBSTRATE

CROSS-REFERENCE TO RELATED APPLICATIONS

This application claims the benefit of Provisional Patent Application Ser. No. 61/053,078, entitled "Method of Applying Film to a Substrate," filed May 14, 2008 in the United States Patent and Trademark Office by the present inventor, which is incorporated herein by reference as if reproduced in full below.

STATEMENT REGARDING FEDERALLY SPONSORED RESEARCH OR DEVELOPMENT

Not Applicable.

BACKGROUND OF THE INVENTION

1. Field of the Invention

This application relates generally to the application of designs on at least semi-transparent substrates and more specifically to a method of creating a design on an at least semi-transparent substrate using film.

2. Description of the Related Art

Semi-transparent or transparent substrates, such as glass panels, are commonly encountered inside and outside of structures, homes, offices, and cars. In particular windows are often made of an at least semi-transparent material, and furniture is often topped with a glass surface. Additionally, glass room dividers and wall hangings are used.

Window tinting film is used on glass surfaces for insulation, ultraviolet protection, providing shade, visibility reasons, and decoration. Window tinting films are available in different colors, shades, levels of transparency, and textures. The film is applied directly to the surface of the glass.

In addition to window tinting films, signs and designs are commonly placed on at least one surface of a glass panel.

BRIEF SUMMARY OF THE INVENTION

According to an embodiment of the invention a process for creating a multi-shade design on an at least semi-transparent substrate having a first surface and a second surface comprises the following described steps. A template preparing step comprising preparing a template on the substrate second surface, the template being visible through the substrate by a viewer on the side of the first surface of the substrate. A first design-film-applying step comprising applying a first design film to the first surface of the substrate over at least a portion of the template. A first design-carving step comprising carving the first design film to create at least a first design region. At least one subsequent design-film-applying step comprising applying at least one subsequent design film to the substrate wherein the at least one subsequent design film at least partially overlaps the first design region. At least one subsequent design-carving step comprising carving the at least one subsequent design film to create a subsequent design region that at least partially overlaps the first design region.

A process for creating a multi-color design on an at least semi-transparent substrate having a first surface and a second surface comprises the following described steps. A template-preparing step comprising providing a template, of a multi-color design containing at least two different colors, on the second surface of the substrate. The template being visible through the substrate by a viewer on the side of the first surface of the substrate. A first design-film-applying step of applying a first design film, of a first color, on the first surface of the substrate, at least partially over the template. A first design-carving step of carving the first design region from the first design film. At least one subsequent design-film-applying step of applying at least one subsequent design film, of at least one second color, on the first surface of the substrate at least partially overlapping the first design film. At least one subsequent design-carving step of carving the at least one subsequent design film to create at least one subsequent design region that at least partionally overlaps the first design region.

Further according to the invention the design may a representation of a sports arena or a portion thereof.

Further according to the invention the substrate may be erasably marked upon as a dry erase board and the manufactured design may serve as a template for the markings.

BRIEF DESCRIPTION OF THE DRAWINGS

For a more complete understanding of some embodiments of the invention, reference is now made to the following Detailed Description taken in conjunction with the accompanying drawings, in which.

DESCRIPTION OF THE INVENTION

Figure 1:
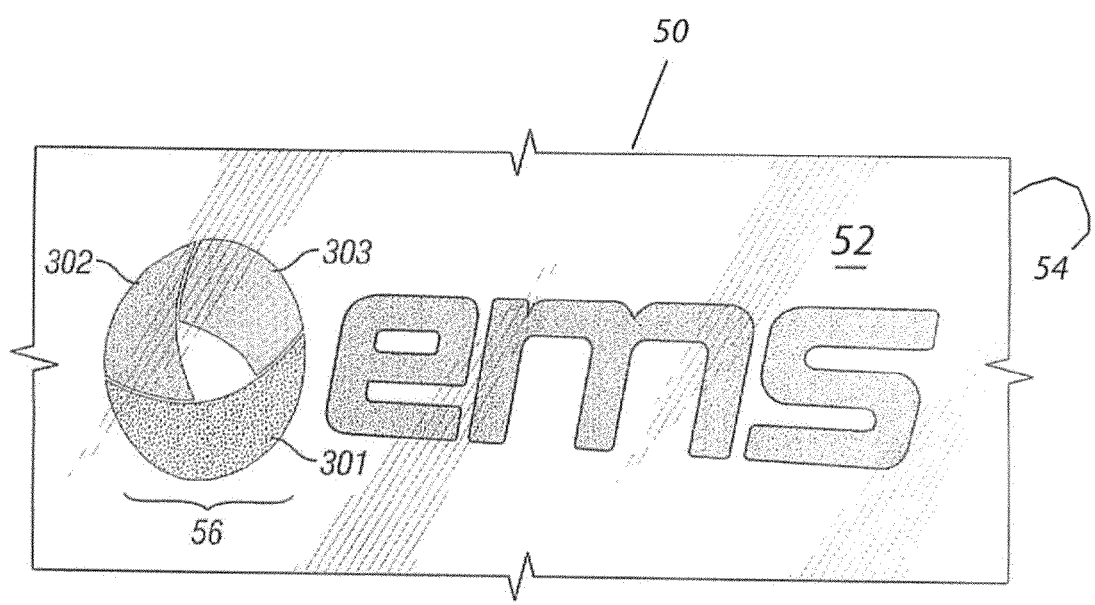
FIG. 1 is a multi-shade design produced by an exemplary process.

Embodiments of the invention are best understood by referring to the drawings, like numerals being used for like and corresponding parts of the various drawings.

Figure 3:
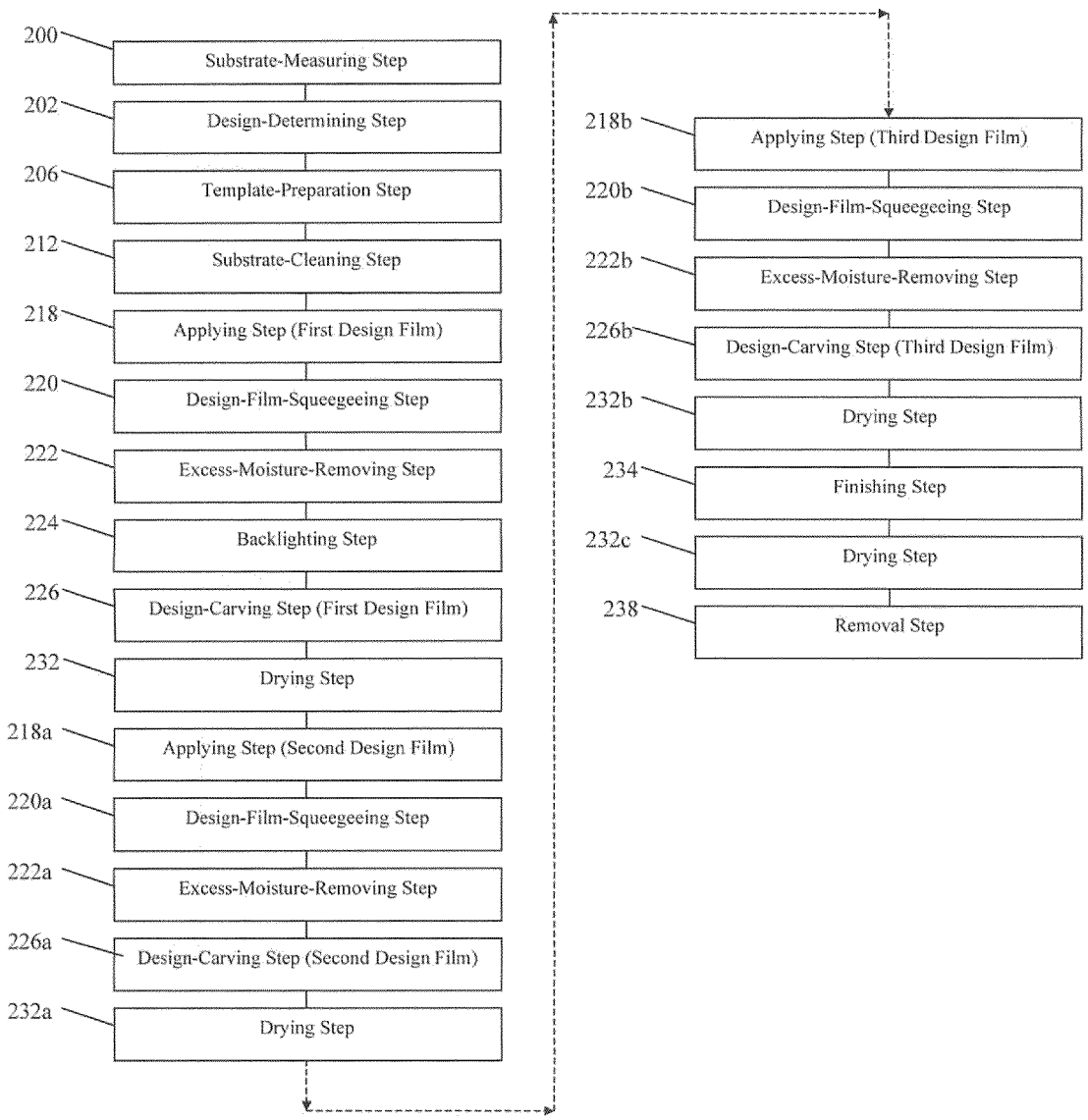
FIG. 3 is a flow chart depicting the steps of a multi-shade or multi-color creating process.
Figure 4:
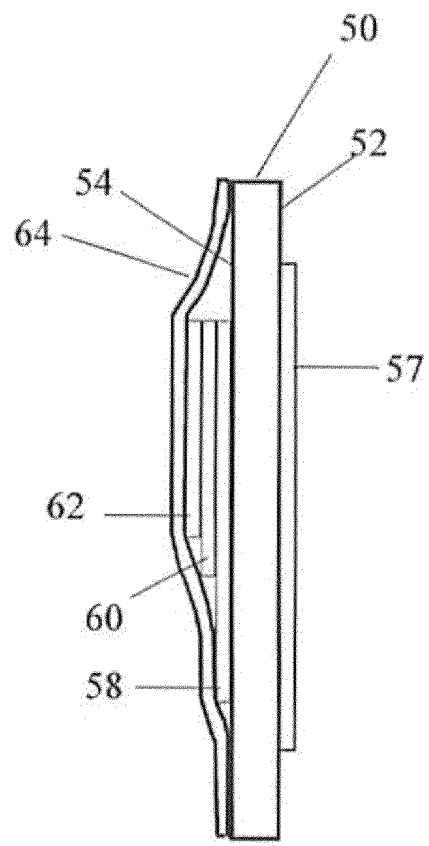
FIG. 4 is a is a side view of FIG. 2.

Referring to FIGS. 1, 3, and 4, an exemplary process 100 comprises creating a multi-shade design 56 on a substrate 50. An exemplary substrate 50 is a transparent or semi-transparent material, such as glass. Substrate 50 has a first surface 52 and a second surface 54.

An exemplary process 100 includes a template preparing step 206, a first design-film-applying step 218 for applying a first design film 58, a first design-carving step 226 for carving the first design film 58, at least one subsequent design-film-applying step 218a for applying at least one subsequent design film 60, at least one subsequent design-carving step 226a for carving the at least one subsequent design film 60, at least one additional design-film-applying step 218b for applying at least one additional design film 62, at least one additional design-carving step 226b for carving the at least one additional design film 62. The above listed process steps are described below.

Referring to FIG. 3, the exemplary process 100 steps are shown.

An exemplary process 100 may include a substrate-measurement step 200. The dimensions of first surface 52 of substrate 50 are measured. The measurements are obtained in any location where substrate 50 is located. These locations include, but are not limited to, the installation site, the manufacturing site, the retail location, the wholesale location, or any other location where such measurements may be taken.

An exemplary process 100 may include a design-determining step 202 for determining what design 56 will be utilized on substrate 50. Design 56 must have at least a first design region 301 of a first shade and a second design region 302 of a second shade. Design 56 may have one or more additional design regions 303 of additional shades. Exemplary process 100 includes a template-preparation step 206.

For the multi-shade effect described herein utilizing exemplary process 100, it is contemplated that the design films 58, 60 and 62 are at least partially transparent to allow some light to pass through.

Template preparing step 206 comprises causing a template of the multi-shade design 56 to be visible from the side of first surface 52 by preparing a template of design 56 on second surface 54. Specific methods of template preparation are described below.

A side view of template 57 is shown in FIG. 4. It is noted that template 57 may consistent of a drawing or design made on surface 54 of substrate 50, including a drawing or design made with washable or removable marking materials.

An exemplary process 100 may include a substrate-cleaning step 212. Water or a cleansing agent and water mixture is generally utilized; however, any now known or later discovered cleansing solution may be utilized for cleansing substrate 50 and removing foreign particles, paint, tape, adhesive, and/or other contaminates from substrate 50. The cleansing solution is sprayed onto substrate 50. A commercially available scraper, or other scraping device, is used to clean substrate 50. Preferably, the cleansing mixture is applied at least two times. The second application is removed utilizing a commercially available soft rubber squeegee, or similar device. Each edge of substrate 50 is wiped with a non-abrasive absorbent material to remove any excess water or cleansing solution from substrate 50 and to ensure the edges are completely dry. Exemplary non-abrasive absorbent materials include but are not limited to soft paper towels, cloths, and other similar absorbent materials.

A first design-film applying step 218 is used to apply a first design film 58 to first surface 52 over at least one determined design region of the prepared multi-shade design template. In the exemplary embodiment, first design film 58 is applied to cover design regions 301, 302 and 303 as the shade color element of design 58 will be incorporated in all of regions 301, 302 and 303. As will be further described herein, at least one subsequent design film 60 will be applied to at least one subsequent design region 302. At least on subsequent design film 60, in combination with first design film 58 will create a different shade effect in the at least on subsequent design region 302, because of the overlap of the at least on subsequent design film 60 over first design film 58. Such difference in shade effect may be enhanced by using a second deign film 60 of a different level of opacity than first design film 58.

Film is generally supplied with a backing (not shown) covering the adhesive side of film. The backing is removed and the adhesive surface of the first design film 58 is activated. Such activation may be achieved by spraying the adhesive surface with a liquid, such as water or a cleansing solution, to activate the adhesive coating. The liquid may also be sprayed onto first surface 52 of substrate 50. First design film 58 is applied to first surface 52 of substrate 50 directly over the template prepared in template-preparation step 206.

An exemplary process 100 may include a design-film-squeegeeing step 220. After applying step 218, a rubber squeegee is passed over the film to remove as much cleaning solution as possible from between the film and the underlying surface 50. Rubber squeegee is defined herein to include other similar devices.

An exemplary process 100 may include an excess-moisture-removal step 222 subsequent to applying step 218 and preferably subsequent to design-film-squeegeeing step 220. An absorbent material is wrapped around an edge of a stiff flat member. The stiff flat member is scraped along the film with the absorbent material wrapped side adjacent the film to remove excess moisture and to aid in securing the film to substrate 50. An exemplary absorbent material is a paper towel and an exemplary stiff flat member is a plastic card.

An exemplary process 100 may include a backlighting step 224. A backlight is aimed at second surface 54. This illuminates the template on second surface 54 making it easier to see the template from the side of first surface 52 of substrate 50. The backlight may be ambient light.

A first design-carving step 226 is used to carve the first design film 58 to create all regions of the design in which it is desired to utilize design film 58. In the exemplary embodiment shown in FIG. 1, such regions include design regions 301, 302 and 303. At least a portion of design 56 is carved out of first design film 58 utilizing any number of standard tools, including but not limited to olfa knives, plastic triangles, circle templates, French curve templates and the like in order to carve out design 56 from the first design film 58. Template 57 is viewed through design film 58 and is used as a guide to carve out the multi-shade design 56 from the first design film 58. The excess pieces of first design film 58 are cut away and removed carefully so as not to disturb the remaining portions of the film.

In exemplary process 100 excess-moisture-removal step 222 may be repeated to remove excess moisture, to secure the first design film 58, and additionally to secure the edges of the first design film 58 to first surface 52 of substrate 50.

An exemplary process 100 may include a drying step 232. The first design film 58 is allowed to dry. The drying time required will vary but preferably at least 12 hours are allowed.

In exemplary process 100, at least one subsequent applying step 218a is used to apply a second design film 60 to determined design regions. In the exemplary process shown at least one subsequent design film 60 is applied to design regions 302 and 303. The at least one subsequent design film 60 overlaps first design film 58. Design regions 302 and 303 overlap creating a darker shade is in design regions 302 and 303 when compared to region 301. In like manner to steps 220 and 222, a design-film-squeegeeing step 220a and an excess-moisture-removing step 222a may be utilized.

In the exemplary embodiment, at least one subsequent design-carving step 226a involves carving the design of region 302 and region 303 so that the at least one subsequent design film 60 covers regions 302 and 303. The excess pieces of the at least one subsequent design film 60 are cut away and removed carefully so as not to disturb the remaining portions of the film.

In a manner like drying step 232, a second drying step 232a may allow for drying of design film 60. The drying time required will vary but preferably at least one hour is allowed, and more preferably at least 12 hours are allowed.

In exemplary process 100, at least one additional design-film-applying step 218b is used to apply at least one additional design film 62 to determined design regions. In the exemplary process shown third design film 62 is applied to design region 303. The at least one additional design film 62 overlaps first design film 58 and at least one subsequent design film 60 in design region 303. Design region 303 creates a darker shade when compared to design region 302. In like manner to steps 220 and 222, a design-film-squeegeeing step 220b and an excess-moisture-removing step 222b may be utilized.

In the exemplary embodiment, the at least one additional design-carving step 226b involves carving the design of region 303 so that the at least one additional design film 62 covers region 303. The excess pieces of the at least one additional design film 62 are cut away and removed carefully so as not to disturb the remaining portions of the film.

In a manner like drying step 232, a third drying step 232b may allow for drying of design film 62. The drying time required will vary but preferably at least one hour is allowed, and more preferably at least 12 hours are allowed.

Referring to FIG. 1, the manufactured design 56 has three shades and a three-dimensional appearance results. Because of overlapping films 58 and 60 in design region 302, design region 302 appears darker that design region 301. Because of overlapping films 58, 60 and 62 in design region 303, design region 303 appears darker than design region 302.

The shading effect in any design region, such as design region 303, may be enhanced by using a film, in this example film 62, of greater opacity or of a different finish, than one or more of the other design films, in this case, film 58 or film 60.

An exemplary process 100 may include a finishing step 234. A finishing film 64 is measured to cover first surface 52 of substrate 50. Finishing film 64 may have an adhesive surface or may be attached by applying an adhesive to the surface of film 64 to be attached to substrate surface 52. Finishing film 64 may be trimmed to substantially cover surface 52 of substrate 50. Preferably, excess-moisture-removal step 222 is repeated. Finishing film 62 seals the design films and protects the design films from potentially damaging exposure. In an alternative embodiment film 62 may only cover a portion of first surface 52 of substrate 50. Alternatively, a portion of the periphery of the finishing film 62 may be removed to create a border around the design films.

In like manner to drying step 232, drying step 232c may be utilized for drying finishing film 62.

An exemplary process 100 may include a removal step 238. Removal step 238 comprises removing template 57 and any other material applied to second surface 54 of substrate 50, including, as applicable, printouts, tracings, marking, and images.

Figure 2:
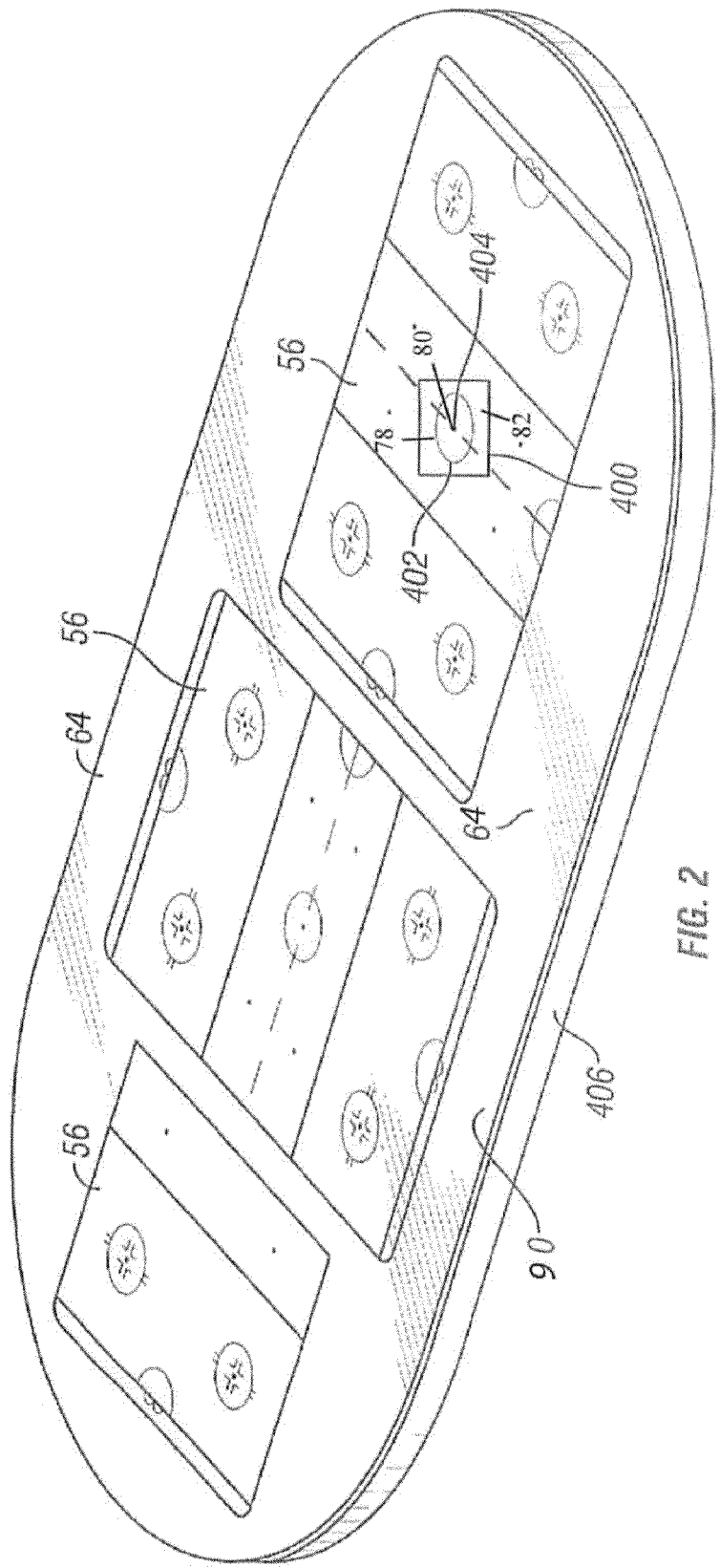
FIG. 2 is a skewed view of a multi-color design produced by an exemplary process.

Referring to FIGS. 2 and 3, the exemplary process 100 previously described herein may be used to create a multi-color design 56 on a substrate 50. More specifically, exemplary process 100 may be used with different colors of films 78, 80 and 82 to create a multi-color effect.

In the multi-color design process, use of different colors of film 78, 80 and 82 may be used to create desired color effects when at least one at least partially transparent design film 78, 80 or 82 is used. It may additionally be desirable to use at least one opaque design film 78, 80 or 82.

Referring to FIG. 2, a marker board substrate 90 having multi-color hockey field designs 56 is shown. Portion 400 may comprise, for example, a red outer circle 402 and a blue inner dot 404.

The marker board substrate 90 of FIG. 2 is supported on a conference table 406. The finishing film 64 may be, for example, a white frosted film. In use it is contemplated that the top surface 54 of the marker board substrate 90 will be glass or an at least partially-transparent material, such as a clear acrylic, with a smooth top surface 54 to optionally allow writing thereon with an erasable marker material, and the design films 78, 80 and 82 located on lower surface 52 of marker board 90.

In the example of FIG. 2, one or more of the fields 56 may be desired to be of a different color than finishing film 64.

An exemplary process 100 includes a template preparing step 206, a first-design-film applying step 218 for applying a first design film 58, a first design-carving step 226 for carving the first design film 58, at least one subsequent design-film-applying applying step 218a for applying at least one subsequent design film 60, and at least one design-carving step 226a for carving the at least one subsequent second design film 60. The above listed process steps are described below.

Referring to FIG. 3 an exemplary process 100 to create a multi-color effect may include a substrate-measurement step 200.

An exemplary process 100 may include a design-determining step 202. Exemplary designs 56 include depictions of arenas such as basketball courts, football playing fields, hockey rinks (shown), baseball fields, soccer fields, and the like. Designs 56 are not limited to sports themed depictions as design 56 may encompass graphic, literal and/or informational content of any source.

Template preparation step 206 comprises causing a template 57 to be visible from the side of first bottom surface 52 by preparing a design template 57 on second top surface 54.

A first design-film-applying step 218 comprises applying a first design film 78 of a first color over first surface 52 and over a corresponding template region to be viewed, such as region 404. A first design-carving step 226 is used to carve region 404 of design 56 from a first design film 78. In manner like design-film-squeegeeing step 220 previously described herein, a design-film-squeegeeing step 220 may be used. In manner like excess-moisture-removal step 222 previously described herein, an excess-moisture-removal step 222 may be performed.

At least one subsequent design-film-applying step 218a is repeated to apply at least one subsequent design film 80 of at least one second color over the first surface 52 in a second design region 402 pursuant to the multi-color design template. Design-film-squeegeeing step 220a and excess-moisture-removal step 222a may be conducted in like manner to steps 220 and 222 respectively. Drying step 232a may be conducted in like manner to drying step 232.

At least one additional design-film-applying steps 218b, design-carving steps 226b, and associated additional steps may be repeated as desired to create additional design regions of the same or different colors. Subsequently-applied design films may overlap previously-installed design films to identify areas. For example design region 404 may comprise a dot, design region 402 may comprise a ring, and design region 400 may comprise a colored design film 82 that overlays design regions 402 and 404.

Finishing step 234 may be performed. An exemplary finishing film 64 is frosted film providing a strong contrast between the design films and finishing film 64. A section of the finishing film 64 may be cut from the periphery of surface 52 to form a border thereabout. In like manner to drying step 232, a drying step 232c may be used.

A further alternative embodiment incorporates the invention into a conference table, marker board, marquee or the like. Referring to FIG. 2, as an illustration of this embodiment, a conference table and marker board combination is shown.

The procedure may be performed on a free-standing substrate 90 or it may be performed on the substrate 50, 90 as it is mounted in a support 406. The substrate 50, 90 may be constructed of tempered glass with beveled edges.

The substrate 50, 90 may be enclosed within a support system 406 such as a table frame for use. The substrate 50, 90 may be hung on a wall or other similar support. Dry-erase markers, or other marking material, can be used on the substrate 50, 90 so that the board may in essence be used as a dry-erase board.

Exemplary process 100 may include mounting step 242, comprising, in the exemplary embodiment, placing the marker board substrate 90 on the table 406 with lower surface 52 adjacent table 406.

Exemplary process 100 may include a template removal step 238.

A suitable marking device, such as a dry-erase marker, may be repeatedly used to mark on marker board substrate 50 and a suitable erasing means, such as a dry-erase eraser, may be repeatedly used to erase the markings, so that marker board substrate 50 functions as a dry-erase board.

Various specific methods and alternatives may be used in conjunction with the above-described processes.

Design 56 may be selected from existing designs 56 or developed for use in process 100. Exemplary designs 56 include but are not limited to logos, patterns, slogans, Company names, trademarks, depictions of games fields, or any other type or form of design 56. Exemplary designs 56 may be informational, literal, and/or graphic. Design-determining step 202 may include determining, based in whole or in part on the information obtained during substrate measurement step 200, the size of design 56 and placement of design 56 in relation to substrate 50.

In an alternative embodiment a substrate-measurement step 200 may comprise measuring the final receiving location or surface. Substrate 50 may be sized to fit the final receiving location or surface. Alternatively, a support system may be sized to fit a specific substrate 50. In an alternative embodiment, substrate 50 may be sized to accommodate a design 56 having a given size.

Template preparation step 206 may comprise reproducing design 56 in the size to be manufactured on first surface 52 of substrate 50, transferring the reproduced design 56 to paper, and attaching the paper to second surface 54 of substrate 50.

Alternatively, template preparation step 206 may comprise marking a template on second surface 54 of substrate 50. A suitable marking device, such as a dry-erase marker is used to mark design 56 on second surface 54 so that the template may be seen from the side of first surface 52. The term marking a template is defined herein to include marking, drawing, and/or plotting a design, plot, design, and/or template.

Alternatively, template preparation step 206 may comprise projecting an image onto second surface 54 so that a template may be seen from the side of first surface 52.

In an alternative embodiment substrate 50 may be any translucent or semi-translucent substrate 50. Substrate 50 must be sufficiently transparent to allow the template of design 56 disposed on second surface 54 of substrate 50 to be viewed through substrate 50 from the side of first surface 52. The use of a less transparent substrate may be possible when used in conjunction with backlighting step 224. Polymethyl methacrylate or other acrylic glass may be used as substrate 50 provided that substrate 50 will not be subjected to shifts in temperature great enough to flex acrylic glass and distort or otherwise affect the manufactured design 56.

Exemplary films, finishing or design, may be transparent, opaque, or semi-opaque. In alternative embodiments films may be frost films, colored films, colored transparent films, or any combination thereof. Exemplary films may contain ultraviolet protection. Exemplary films come in varying thickness including but not limited to two, four, and seven mil.

Any or all of the aforementioned steps may be repeated as necessary if more than one design is to be placed on substrate 50 and/or more shades or colors are to be used to produce the complete design 56.

The steps described above may be performed in alternative sequential orders. For example, design-determining step 202 may be performed prior to substrate-measuring step 200 because the design may be created and/or decided upon prior to the determination of its location on substrate 50. By further example, substrate-cleaning step 212 may be performed prior to template preparation step 210. Alternatively, any of the aforementioned or hereinafter mentioned steps or processes may be repeated. Exemplary reasons for repetition include manufacture of additional designs 56, manufacture of more detailed designs 56, and other reasons. Nonetheless, in any particular embodiment it may be necessary or convenient to perform certain steps prior to or subsequent to other steps.

All or less than all of the aforementioned steps may be combined in a single process 100. In particular, the process of creating a multi-shade design may be combined with the process of creating a multi-color design to manufacture a multi-shade, multi-color design.

I claim:

1. A process for creating a multi-shade design, on an at least partially-transparent substrate, said substrate having a first surface and a second surface, comprising:
    a template-preparing step comprising providing a template, said template being a design that provides for at least two design regions, on said substrate second surface;
    a first design-film-applying step of applying a first design film to said substrate first surface over at least two of said design regions;
    a first design-carving step of carving said first design film according to said template;
    at least one subsequent design-film-applying step of applying at least one subsequent design film to said substrate first surface over at least one said design region, wherein said subsequent design film at least partially overlaps said first design film at said at least one said design region;
    at least one subsequent design-carving step of carving said at least one subsequent design film according to said template wherein at least a portion of said at least one subsequent design film continues to overlap said at least one said design region thereby creating at least one shaded design region in relation to at least one less-shaded design region.

2. The process of claim 1 wherein said first design film is at least partially transparent; and wherein at least one said subsequent design-film-applying step utilizes at least one design film having a different finish than at least one design film utilized in a said first previous said design-film-applying step.

3. The process of claim 2 further comprising:
    a finishing step of applying a finishing film over said substrate first surface, said first design film, and said subsequent design film; and
    a template removal step.

4. The process of claim 3 further comprising:
    at least one additional design-film-applying step of applying an additional design film to said substrate first surface at least partially overlapping one of said first design region and said at least one subsequent design region;
    at least one additional design-carving step of carving said additional design film to create at least one additional design region at least partially overlapping one of said first design region and said at least one subsequent design region; and
    said at least one additional design-film applying step and said at least one additional design-carving step preceding said finishing step.

5. The process of claim 1 further comprising:
    a drying step comprising allowing the freshly carved design film applied in any said design-film-applying step to dry for an appropriate time prior to performing a subsequent design-film-applying step.

6. The process of claim 3 further comprising:
a design-film-squeegeeing step comprising passing a squeegee over said first substrate surface and at least one of said first design film and said at least one subsequent design films; and
an excess-moisture-removal step comprising applying an absorbent material to said first substrate surface and at least one of said first design film and said at least one subsequent design films.

7. The process of claim 1 further comprising:
a backlighting step prior to said first design-carving step.

8. The process of claim 1 wherein:
said step for preparing a template comprises marking a template on said second substrate surface.

9. The process of claim 1 wherein:
said subsequent design-film-applying step utilizes a design film having a different opacity than at least one previous design film used in a prior performed design-film-applying step.

10. A process for manufacturing a multi-color design on an at least partially-transparent substrate, said substrate having a first surface and a second surface, comprising:
a template-preparing step comprising providing a template, said template being a design that provides for at least two design regions, of said multi-color design on said substrate second surface;
a first design-film-applying step of applying a first design film of a first color to said first surface of said substrate at an area corresponding to said template; a first design-carving step of carving said first design film to create a first design region from said first design film;
at least one subsequent design-film-applying step of applying at least one subsequent design film of at least one second color to said substrate first surface at an area corresponding to said template wherein said subsequent design film at least partially overlaps said first design film at said at least one said design region;
a subsequent design-carving step of carving said at least one subsequent design film to create at least one subsequent design region wherein at least a portion of said at least one subsequent design film continues to overlap said at least one said design region;
and, a mounting step comprising mounting said partially-transparent substrate in a desired location.

11. The process of claim 10 wherein a dry-erase marker may be utilized in conjunction with said partially-transparent substrate; and wherein said marker is applied to said substrate second surface.

12. The process of claim 11 further comprising a finishing step of applying a finishing film over said substrate first surface, said first design film, and said at least one subsequent design film, wherein a border is formed around the periphery of the substrate.

13. The process of claim 12 further comprising:
at least one additional design-film-applying step of applying at least one additional design film to said substrate first surface at an area corresponding to said template;
at least one additional design-carving step of carving said at least one additional design film to create at least one additional design region; and
said at least one additional design-film applying step and said at least one additional design-carving step preceding said finishing step.

14. The process of claim 10 further comprising;
a backlighting step prior to said first design-carving step;
a template removal step; and
wherein at least one of said first design film and said subsequent design film is at least partially transparent.

15. The process of claim 12 further comprising:
a design-film-squeegeeing step comprising passing a squeegee over said first substrate surface and at least one of said first design film and said at least one subsequent design film;
an excess-moisture-removal step comprising applying an absorbent material to said first substrate surface and at least one of said first design film and said at least one subsequent design film; and
said step for preparing a template comprises marking a template on said second substrate surface.

16. The process of claim 10 wherein said mounting step further comprises mounting said partially-transparent substrate to a piece of furniture.

17. The process of claim 16 wherein said piece of furniture in said mounting step comprises a table.

18. The process of claim 10 wherein said at least one subsequent design film and said at least one additional design film each at least partially overlap said first design film.

19. The process of claim 10 wherein said at least one subsequent design-film applying step is repeated at least once; and wherein said at least one subsequent design-carving step is repeated at least once.

20. The process of claim 10 wherein said mounting step further comprises mounting said partially-transparent substrate on a wall.

* * * * *